(12) United States Patent
Suvanto

(10) Patent No.: US 9,975,760 B2
(45) Date of Patent: May 22, 2018

(54) MEMS SENSOR DEVICE PACKAGE HOUSING WITH AN EMBEDDED CONTROLLABLE DEVICE

(71) Applicant: Robert Bosch GmbH, Stuttgart (DE)

(72) Inventor: Mikko VA Suvanto, Pittsburgh, PA (US)

(73) Assignee: Robert Bosch GmbH, Stuttgart (DE)

(*) Notice: Subject to any disclaimer, the term of this patent is extended or adjusted under 35 U.S.C. 154(b) by 0 days. days.

(21) Appl. No.: 15/195,061

(22) Filed: Jun. 28, 2016

(65) Prior Publication Data

US 2017/0369305 A1 Dec. 28, 2017

(51) Int. Cl.
*H01L 29/84* (2006.01)
*B81B 7/00* (2006.01)
*B81C 1/00* (2006.01)
*H04R 1/32* (2006.01)

(52) U.S. Cl.
CPC .......... *B81B 7/008* (2013.01); *B81C 1/0023* (2013.01); *H04R 1/326* (2013.01); *B81B 2201/0207* (2013.01); *B81B 2201/0214* (2013.01); *B81B 2201/0235* (2013.01); *B81B 2201/0242* (2013.01); *B81B 2201/0257* (2013.01); *B81B 2201/0264* (2013.01); *B81B 2201/0278* (2013.01); *B81B 2201/0292* (2013.01); *B81B 2207/012* (2013.01); *H04R 2201/003* (2013.01)

(58) Field of Classification Search
CPC ............ B81B 7/008; B81B 2201/0207; B81B 2201/0214; B81B 7/0023; B81B 7/0207; B81B 7/0214; B81C 1/0023
USPC ....................................................... 257/416
See application file for complete search history.

(56) References Cited

U.S. PATENT DOCUMENTS

| | | | | |
|---|---|---|---|---|
| 2005/0069164 A1* | 3/2005 | Muthuswamy | ........ | H04R 19/04 381/369 |
| 2008/0101630 A1* | 5/2008 | Akino | .................... | H04R 19/04 381/190 |
| 2010/0290661 A1* | 11/2010 | Baumhauer, Jr. | ...... | H04R 1/083 381/361 |
| 2013/0088941 A1* | 4/2013 | Elian | ..................... | B81B 7/0061 367/99 |
| 2017/0142524 A1* | 5/2017 | Sooriakumar | ........ | B81B 7/0061 |

* cited by examiner

*Primary Examiner* — Mohsen Ahmadi
*Assistant Examiner* — Patricia Reddington
(74) *Attorney, Agent, or Firm* — Maginot Moore & Beck LLP

(57) ABSTRACT

A microelectromechanical system (MEMS) sensor device includes a package housing having a top member, bottom member, and a spacer coupled the top member to the bottom member, defining a cavity. At least one sensor circuit and a MEMS sensor disposed within the cavity of the package housing. A first opening formed on the package housing a control device embedded within the package housing is electrically coupled to the sensor circuit and is controlled to tune the MEMS sensor from a directional mode to an omni-directional mode.

16 Claims, 7 Drawing Sheets

MEMS SENSOR DEVICE PACKAGE HOUSING WITH AN EMBEDDED CONTROLLABLE DEVICE

FIELD

This disclosure relates to microelectromechanical system (MEMS) sensor device packages, particularly, to a control device embedded into a package housing for encapsulating at least one of a MEMS sensor device and a sensor circuit.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure related to systems and methods for embedding a control device into a package housing. For example, the package housing comprises a top member a bottom member, and a spacer having a first surface coupled to the top member and a second surface coupled to the bottom member by any suitable methods of attachment. A control device is embedded within the package housing. An optional opening is formed on the package.

In one embodiment, the control device is embedded within at least one of the top member, the bottom member, the spacer, and the opening. The opening may be a sound inlet port. Within the package housing comprises at least one sensor circuit and one MEMS sensor device.

In accordance with another embodiment, a MEMS sensor device comprises a package housing having a top member, bottom member, and a spacer coupled the top member to the bottom member, defining a cavity. At one MEMS sensor disposed within the cavity of the package housing and an opening formed on the package housing. The MEMS sensor device further comprises first and second control devices embedded within the opening wherein one of the first and second control devices is configured to tune the MEMS sensor from a directional mode to an omni-directional mode. In one embodiment, the first control device is located directly below the MEMS sensor and the second control device in proximal to the first control device is located outside and is not covered by the MEMS sensor. The first and second control devices are selected from a group consisting of piezoelectric moving device, rotating device, a flap, and movable membrane. A circuit either disposed within the cavity or outside the package housing is provided to communicatively couple the first and second control devices to the circuit to tune the MEMS sensor from directional mode to omni-directional mode. The circuit may be a processor, a user input interface, and a computer implemented device, depending on the application.

BRIEF DESCRIPTION OF THE DRAWINGS

These and other features, aspects, and advantages of this disclosure will become better understood when the following detailed description of certain exemplary embodiments is read with reference to the accompanying drawings in which like characters represent like arts throughout the drawings, wherein.

DETAILED DESCRIPTION

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

A client machine may be provided with electronic components, such as sensor devices, speakers, graphical processor units, computer processor units, and any suitable computer implemented devices. The client machine may be a personal computer or desktop computer, a laptop, a cellular or smart phone, a tablet, a personal digital assistant (PDA), a gaming console, an audio device, a video device, an entertainment device such as a television, a vehicle infotainment, a wearable device, a thin client system, a thick client system, or the like.

The sensor devices may be provided that include a package or an enclosure for housing one or more sensors, internal components, or combination thereof. The sensors may be such as MEMS transducers, speakers, receivers, microphones, pressure sensors, thermal sensors, optical sensors, imaging sensors, chemical sensors, gyroscopes, humidity sensors, accelerometers, gas sensors, environmental sensors, motion sensors, navigation sensors, or proximity sensors, or bolometers. The microphones may be electret microphones, capacitive microphones, piezoelectric microphones, silicon microphones, optical microphones, or any suitable acoustic microphones.

Figure 1:
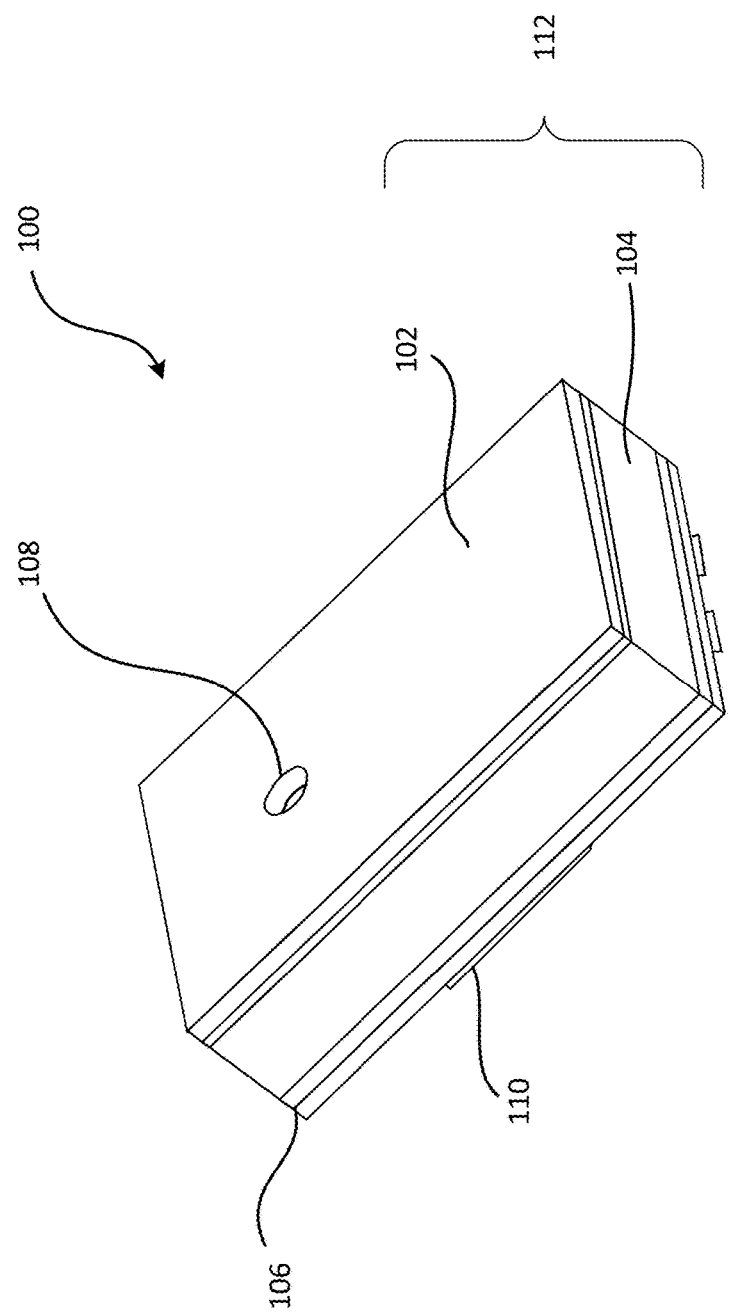
FIG. 1 is a perspective view of a MEMS device package in accordance with embodiments of a disclosure.

FIG. 1 is a perspective of a MEMS device package 100 according to an exemplary embodiment of the disclosure. The package 100 may reside in any client machines includes a package housing 112 having a lid 102, a spacer 104, and a substrate 106 attached to the spacer 104 by any suitable methods of attachment. One or more sensors and/or internal components may be housed within the package 100. The sensors may be such as MEMS transducers, speakers, receivers, microphones, pressure sensors, thermal sensors, optical sensors, imaging sensors, chemical sensors, gyroscopes, humidity sensors, accelerometers, gas sensors, environmental sensors, motion sensors, navigation sensors, or proximity sensors, or bolometers. The internal components may be integrated circuits, ASICs, processors, controllers, energy storage devices, sensor circuitry systems, and any suitable components. Depending on the application, an optional port may be formed on the package 100 by etching, drilling, punching, or any suitable method of forming the port for receiving attributes from an environment which the package 100 is exposed. The attributes may be acoustic signal, pressure signal, optical signal, gas signal, and any suitable signal. As illustrated, the MEMS device package 100 is a MEMS microphone package. Although the MEMS device package 100 as depicted comprises a three piece structure package housing 112, various aspects and configurations either in a single structure package housing, a two piece structure package housing, or more than three piece structure package housing may be used to encapsulate one or more internal components. As an example, the lid 102 and the spacer 104 may be formed as a single structure, defines as a cover or a cap 112. One or more bonding pads 110 may be formed on at least one of the substrate 106 or the cover 112 by any suitable method for mounting the package 100 to an external printed circuit board of the client machine or another support member.

Figure 2:
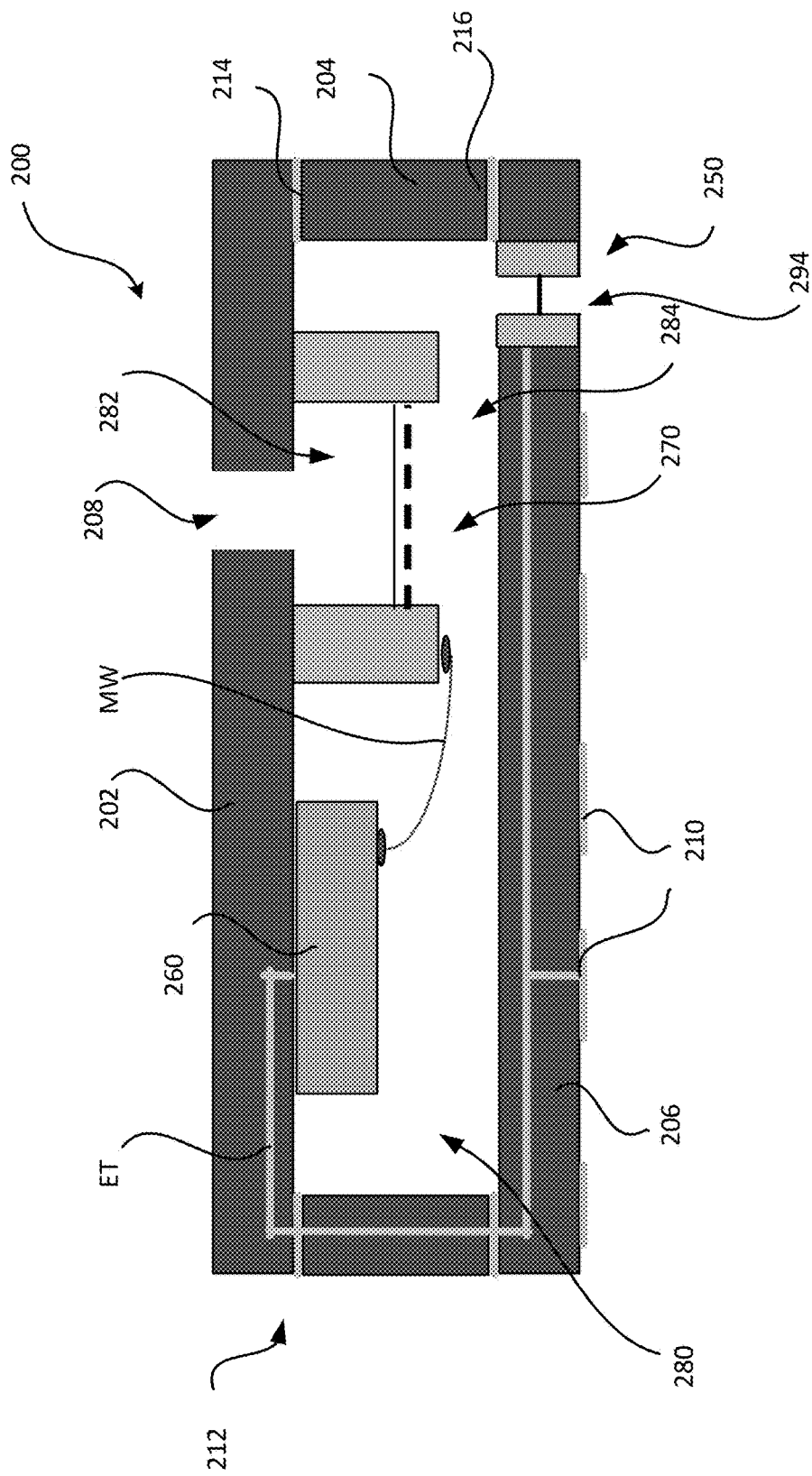
FIG. 2 is a cross-sectional view of an exemplary MEMS device package in accordance with a described embodiment of the disclosure.

FIG. 2 is a cross-sectional view of an exemplary MEMS device package 200 utilizing at least one sensor circuit 260 and a MEMS sensor device 270 in accordance with a described embodiment of the disclosure. The MEMS device package 200 is similar to the MEMS device package 100 depicted in FIG. 1. The MEMS device package 200 comprises a package housing 212 having a top member 202, a bottom member 206, and a spacer 204 having a first surface 214 coupled to the top member and a second surface 216 coupled to the bottom member by any suitable methods of attachment. The sensor circuit 260 and the MEMS sensor device 270 are mounted to the package housing 212 of the MEMS device package 200 by any suitable method of attachment. Depending on the applications, more than one MEMS sensor device and sensor circuit may be encapsulated in the package housing 212. The sensor circuit 260 and the MEMS sensor device 270 are electrically interconnected by wire bonding MW to transmit signal via embedded traces ET formed within the package housing 212 which in turn output the transmitted signal externally via at least one bond pad 210 mounted on back side of the bottom member 206. The package 200 is then mounted to an external assembly such as a printed circuit board. As illustrated, the sensor circuit 260 and the MEMS sensor 270 are mounted to the top member 202 of the package housing 212. In some embodiments, the sensor circuit 260 and the MEMS sensor 270 may be mounted to either the bottom member 206 or the spacer 204 of the package housing 212. In another embodiments, the sensor circuit 260 and the MEMS sensor 270 may be mounted to any location within the package housing 212. As an example, the sensor circuit 260 is mounted to the top member 202 whereas the MEMS sensor 270 is mounted to either the bottom member 206 or the spacer 204. As another example, the sensor circuit 260 is mounted to the spacer 204 whereas the MEMS sensor 270 is mounted to either the top member 202 or the bottom member 206. The top and bottom members 202, 206 may be a lid, a cap, a substrate, or combination. As illustrated, the top member 202 is a lid and the bottom member 206 is a substrate.

The MEMS device package 200 further includes a control device 250 embedded within the package housing 212. As an example, the control device 250 is embedded within at least one of the top member 202, the bottom member 206, the spacer 204, and an opening or a port 208. The opening 208 may be a sound inlet port. The control device 250 embedded within the package housing 212 may be formed from the same material as the package housing 212. The control device 250 and the package housing 212 are fabricated in a single or sample process. In some embodiments, the control device 250 and the package housing 212 may be fabricated in multiple process. As an example, the control device 250 is inserted and flushed within a second port 294. A suitable attachment such as adhesive is applied to one of the control device 250 or the port to secure the control device 250 to inner wall of the port. In another example, the port includes a flange bent inwardly for receiving the control device 250. The control device 250 is then secured to the flange by any suitable method of attachments. In other example, the control device 250 may be partially flushed within the port having a portion of the control device 250 either extended above the port or below the port. In one embodiment, the control device 250 is a rotating assembly having an inner member and an outer member rotatably coupled to the inner member. When the outer member turns in relation to the inner member, either clockwise or counter-clockwise, the rotating assembly closes or open the port. In another embodiment, the control device 250 is a flap to either close the port when the flap is fully extended or open the port when the flap is retracted. In yet another embodiment, the control device 250 is a movable member such as a membrane, a diaphragm, or the like to either close the port when the moving member is fully extended or open the port when the moving member is retracted. In yet further embodiment, the control device 250 is a piezoelectric moving member that open and close the port to change the directivity functionality of the MEMS sensor device 270. Otherwise suitable moving control device may be used to open and close the port to change the directivity functionality of the MEMS sensor device 270. As depicted, the control device 250 embedded within the bottom member 206 and is located behind the MEMS sensor 270 serves to change the directional properties of the MEMS sensor 270 mounted within a cavity 280 defined by the package housing 212. The control device 250 may be controlled by the sensor circuit 260, a processor, a user input interface, or any suitable computer implemented device to change the directivity of the MEMS sensor device 270 from a directional mode when the control device 250 is open and to a non-directional mode such as omni-directional mode when the control device 250 is closed. To interface with the control device 250, any suitable connections such as flip chip connection, bond wires, flex board, conductive layers, or the like may be used to connect the control device 250 to the sensor circuit 260, a processor, a user input interface, or any suitable computer implemented device which then is controlled to open and close the control device 250. The integration of the control device 250 into the package housing 212 also changes the characteristics of the package 200. The processor or any suitable computer implemented device may be disposed in the package 200 or located outside the package 200. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (µP), a microcontroller (µC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. The cavity 280 comprises a front volume 282 in fluidly coupled to the MEMS sensor 270 via the opening 208 and a back volume 284 in fluidly coupled to the MEMS sensor 270 via the control device 250. The back volume 284 provides a pressure reference for the MEMS sensor 270. When the control device 250 is closed, the back volume is sealed, and the MEMS sensor 270 is tuned to non-directional or omni-directional MEMS sensor 270. When the control device 250 is open, the back volume is open, and the MEMS sensor 270 is tuned to directional MEMS sensor device 270.

Figure 3:
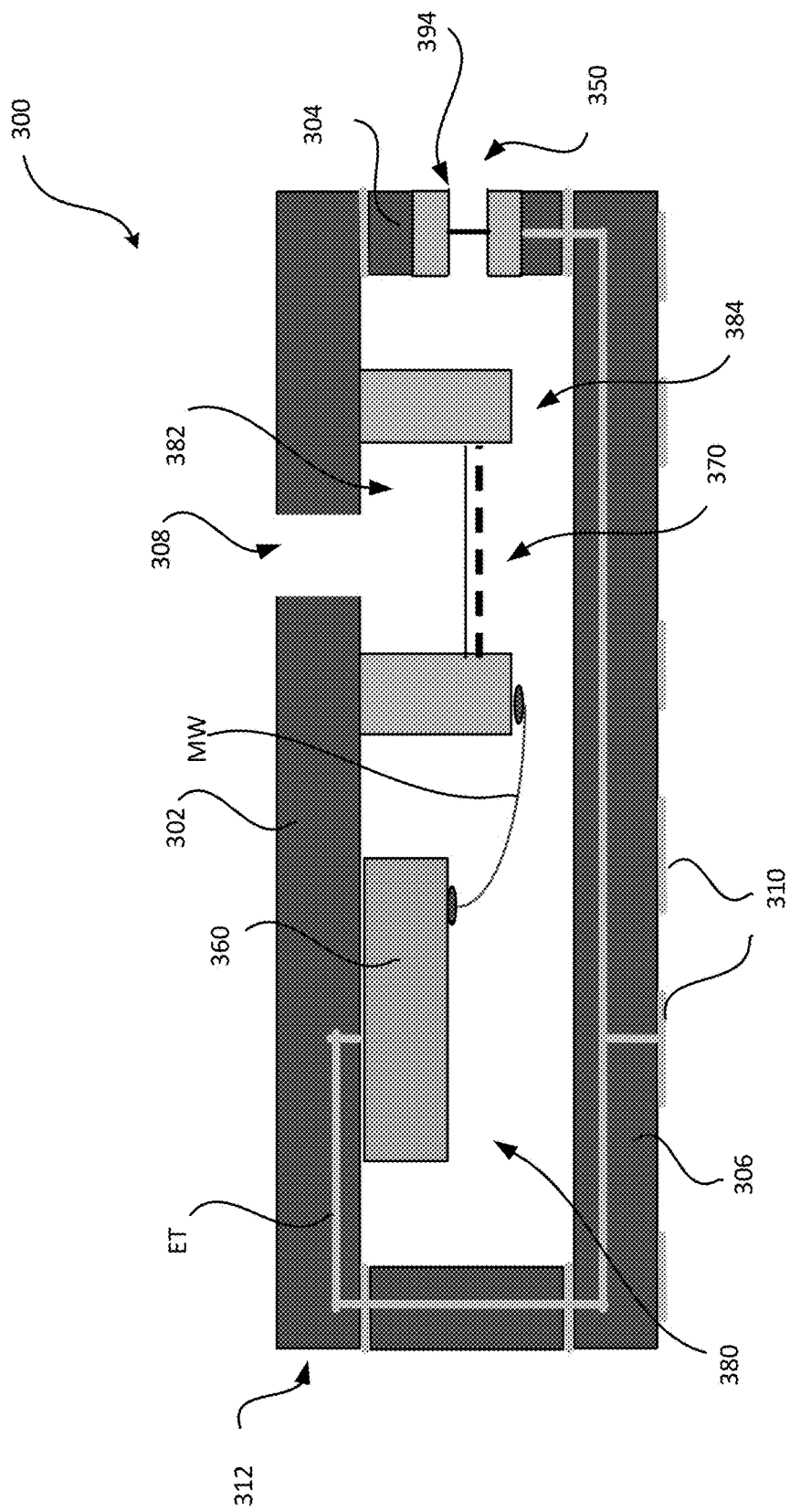
FIG. 3 is a cross-sectional view of an exemplary MEMS device package in accordance with another described embodiment of the disclosure.

FIG. 3 is a cross-sectional view of an exemplary MEMS device package 300 utilizing at least one sensor circuit 360 and a MEMS sensor 370 in accordance with another described embodiment of the disclosure. Unlike from the MEMS device package 200, the MEMS device package 300 includes a control device 350 embedded within a spacer 304 of the package housing 312. The control device 350 embedded within the package housing 312 may be formed from the same material as the package housing 312. The control device 350 and the package housing 312 are fabricated in a single or sample process. In some embodiments, the control device 350 and the package housing 312 may be fabricated in multiple process. As an example, the control device 350 is inserted and flushed within a second port 394. A suitable attachment such as adhesive is applied to one of the control device 350 or the port to secure the control device 350 to inner wall of the port. In another example, the port includes a flange bent inwardly for receiving the control device 350. The control device 350 is secured to the flange by any suitable method of attachments. In other example, the control device 350 may be partially flushed within the port having a portion of the control device 350 either extended above the port or below the port. In one embodiment, the control device 350 is a rotating assembly having an inner member and an outer member rotatably coupled to the inner member. When the outer member turns in relation to the inner member, either clockwise or counter-clockwise, the rotating assembly closes or open the port. In another embodiment, the control device 350 is a flap to either close the port when the flap is fully extended or open the port when the flap is retracted. In yet another embodiment, the control device 350 is a movable member such as a membrane, a diaphragm, or the like to either close the port when the moving member is fully extended or open the port when the moving member is retracted. In yet further embodiment, the control device 350 is a piezoelectric moving member that open and close the port to change the directivity functionality of the MEMS sensor 370. Otherwise suitable moving control device may be used to open and close the port to change the directivity functionality of the MEMS sensor 370. As depicted, the control device 350 embedded within the spacer 304 and is located behind, in front, or adjacent to the MEMS sensor 370 serves to change the directional properties of the MEMS sensor 370 mounted within a cavity 380 defined by the package housing 312. The control device 350 may be controlled by the sensor circuit 360, a processor, a user input interface, or any suitable computer implemented device to change the directivity of the MEMS sensor 370 from a directional mode when the MEMS device 350 is open and to a non-directional mode such as omni-directional mode when the MEMS device 350 is closed. To interface with the control device 350, any suitable connections such as flip chip connection, bond wires, flex board, conductive layers, or the like may be used to connect the control device 350 to the sensor circuit 360, a processor, a user input interface, or any suitable computer implemented device which then is controlled to open and close the control device 350. The integration of the control device 350 into the package housing 312 also changes the characteristics of the package 300. The processor or any suitable computer implemented device may be disposed in the package 300 or located outside the package 300. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (μP), a microcontroller (μC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. The cavity 380 comprises a front volume 382 in fluidly coupled to the MEMS sensor 370 via the opening 308 and a back volume 384 in fluidly coupled to the MEMS sensor 370 via the control device 350. The back volume 384 provides a pressure reference for the MEMS sensor 370. When the control device 350 is closed, the back volume is sealed, and the MEMS sensor 370 is tuned to omni-directional or non-directional MEMS sensor 370. When the control device 350 is open, the back volume is open, and the MEMS sensor 370 is tuned to directional MEMS sensor 370.

Figure 4:
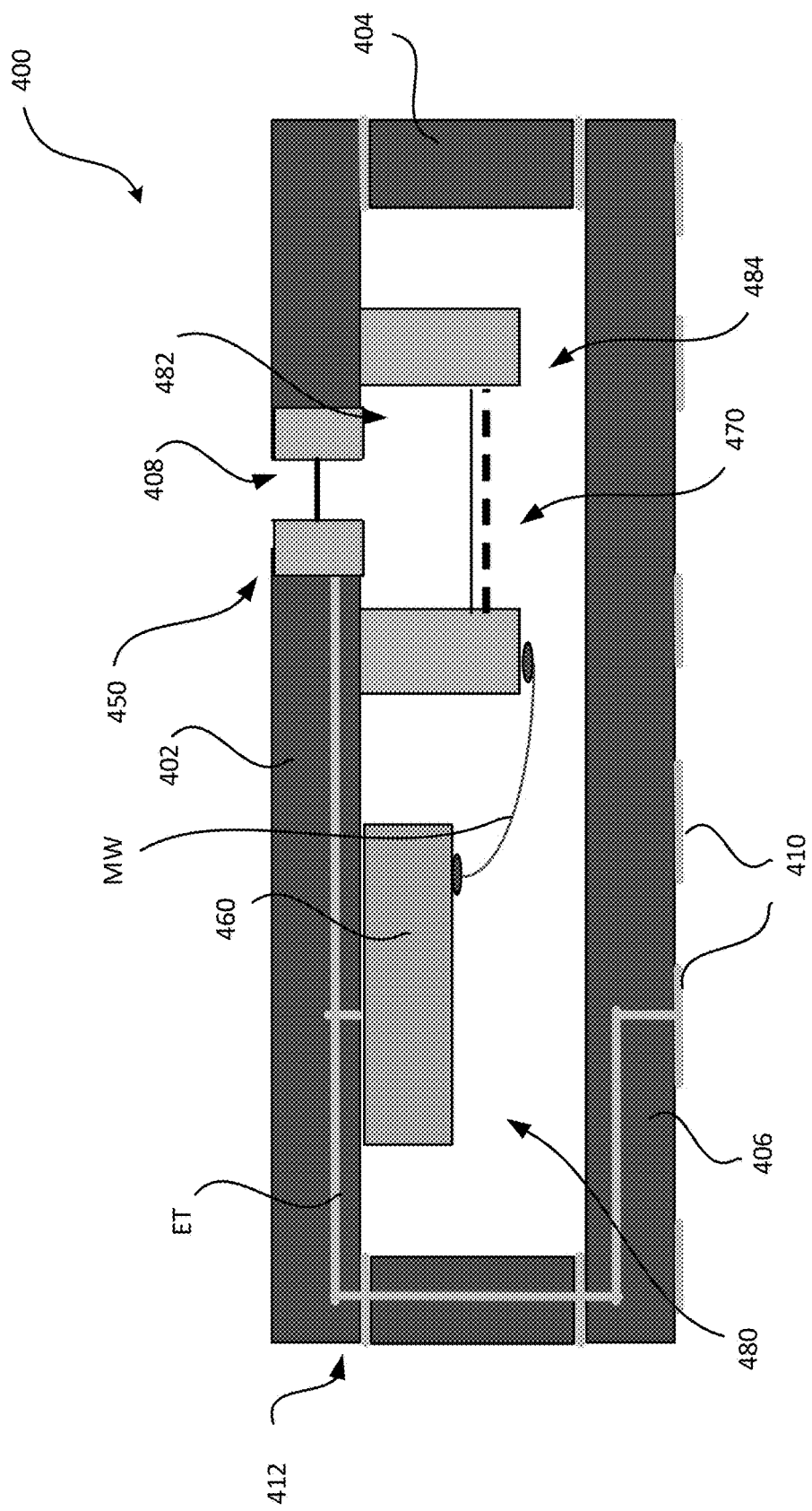
FIG. 4 is a cross-sectional view of an exemplary MEMS device package in accordance with another described embodiment of the disclosure.

FIG. 4 is a cross-sectional view of an exemplary MEMS device package 400 utilizing at least one sensor circuit 460 and a MEMS sensor 470 in accordance with another described embodiment of the disclosure. Unlike from the MEMS device package 300, the MEMS device package 400 includes a control device 450 embedded within an opening 408 formed on a top member 402 of the package housing 412. The control device 450 embedded within the package housing 412 may be formed from the same material as the package housing 412. The control device 450 and the package housing 412 are fabricated in a single or sample process. In some embodiments, the control device 450 and the package housing 412 may be fabricated in multiple process. As an example, the control device 450 is inserted and flushed within the port. A suitable attachment such as adhesive is applied to one of the control device 450 or the port to secure the control device 450 to inner wall of the port. In another example, the port includes a flange bent inwardly and the control device 450 is secured to the flange by any suitable method of attachments. In other example, the control device 450 may be partially flushed within the port having a portion of the control device 450 either extended above the port or below the port. In one embodiment, the control device 450 is a rotating assembly having an inner member and an outer member rotatably coupled to the inner member. When the outer member turns in relation to the inner member, either clockwise or counter-clockwise, the rotating assembly closes or open the port. In another embodiment, the control device 450 is a flap to either close the port when the flap is fully extended or open the port when the flap is retracted. In some embodiments, the flap 450 may be moved in an upward motion or downward motion induced by stimuli, such as magnetic field, electric field, thermal, or the like. In yet another embodiment, the control device 450 is a movable member such as a membrane, a diaphragm, or the like to either close the port when the moving member is fully extended or open the port when the moving member is retracted. In yet further embodiment, the control device 450 is a piezoelectric moving member that open and close the port to change the directivity functionality of the MEMS sensor 470. Otherwise suitable control device may be used to open and close the port to change the directivity functionality of the MEMS sensor 470. As depicted, the control device 450 embedded within the opening 408 and is located behind, in front, or adjacent to the MEMS sensor 470 serves to protect sensor circuit 460 and the MEMS sensor 470 from environmental debris and containment. The control device 450 also serves to change acoustic properties such as damping or resistance. The control device 450 may be controlled by the sensor circuit 460, a processor, a user input interface, or any suitable computer implemented device. The processor or any suitable computer implemented device may be disposed in the package 400 or located outside the package 400. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (μP), a microcontroller (μC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. To interface with the control device 450, any suitable connections such as flip chip connection, bond wires, flex board, conductive layers, or the like may be used to connect the control device 450 to the sensor circuit 460, a processor, a user input interface, or any suitable computer implemented device which then is controlled to open and close the control device 450.

Figure 5:
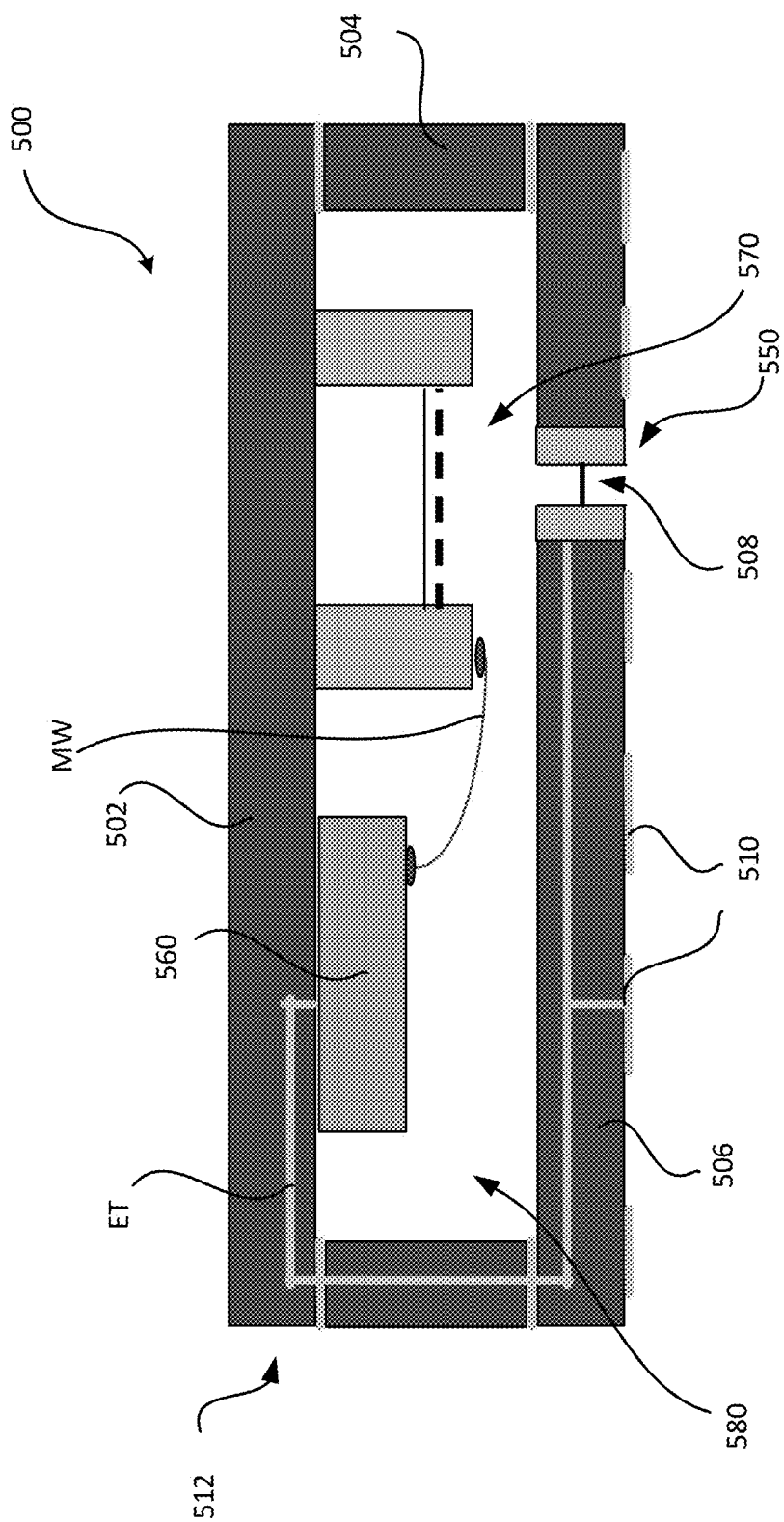
FIG. 5 is a cross-sectional view of an exemplary MEMS device package in accordance with another described embodiment of the disclosure.

FIG. 5 is a cross-sectional view of an exemplary MEMS device package 500 utilizing at least one sensor circuit 560 and a MEMS sensor 570 in accordance with another described embodiment of the disclosure. Unlike from the MEMS device package 400, the MEMS device package 500 includes a control device 550 embedded within an opening 508 formed on a bottom member 506 of the package housing 512. The control device 550 embedded within the package housing 512 may be formed from the same material as the package housing 512. The control device 550 and the package housing 512 are fabricated in a single or sample process. In some embodiments, the control device 550 and the package housing 512 may be fabricated in multiple process. As an example, the control device 550 is inserted and flushed within the port. A suitable attachment such as adhesive is applied to one of the control device 550 or the port to secure the control device 550 to inner wall of the port. In another example, the port includes a flange bent inwardly and the control device 550 is secured to the flange by any suitable method of attachments. In other example, the control device 550 may be partially flushed within the port having a portion of the control device 550 either extended above the port or below the port. In one embodiment, the control device 550 is a rotating assembly having an inner member and an outer member rotatably coupled to the inner member. When the outer member turns in relation to the inner member, either clockwise or counter-clockwise, the rotating assembly closes or open the port. In another embodiment, the control device 550 is a flap to either close the port when the flap is fully extended or open the port when the flap is retracted. In some embodiments, the flap 550 may be moved in an upward motion or downward motion induced by stimuli, such as magnetic field, electric field, thermal, or the like. In yet another embodiment, the control device 550 is a movable member such as a membrane, a diaphragm, or the like to either close the port when the moving member is fully extended or open the port when the moving member is retracted. In yet further embodiment, the control device 550 is a piezoelectric moving member that open and close the port to change the directivity functionality of the MEMS sensor 570. Otherwise suitable control device may be used to open and close the port to change the directivity functionality of the MEMS sensor 570. As depicted, the control device 550 embedded within the opening 508 and is located behind, in front, or adjacent to the MEMS sensor 570 serves to protect sensor circuit 560 and the MEMS sensor device 570 from environmental debris and containment. The control device 550 also serves to change acoustic properties such as damping or resistance. The control device 550 may be controlled by the sensor circuit 560, a processor, a user input interface, or any suitable computer implemented device. The processor or any suitable computer implemented device may be disposed in the package 500 or located outside the package 500. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (μP), a microcontroller (μC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. To interface with the control device 550, any suitable connections such as flip chip connection, bond wires, flex board, conductive layers, or the like may be used to connect the control device 550 to the sensor circuit 560, a processor, a user input interface, or any suitable computer implemented device which then is controlled to open and close the control device 550.

Figure 6:
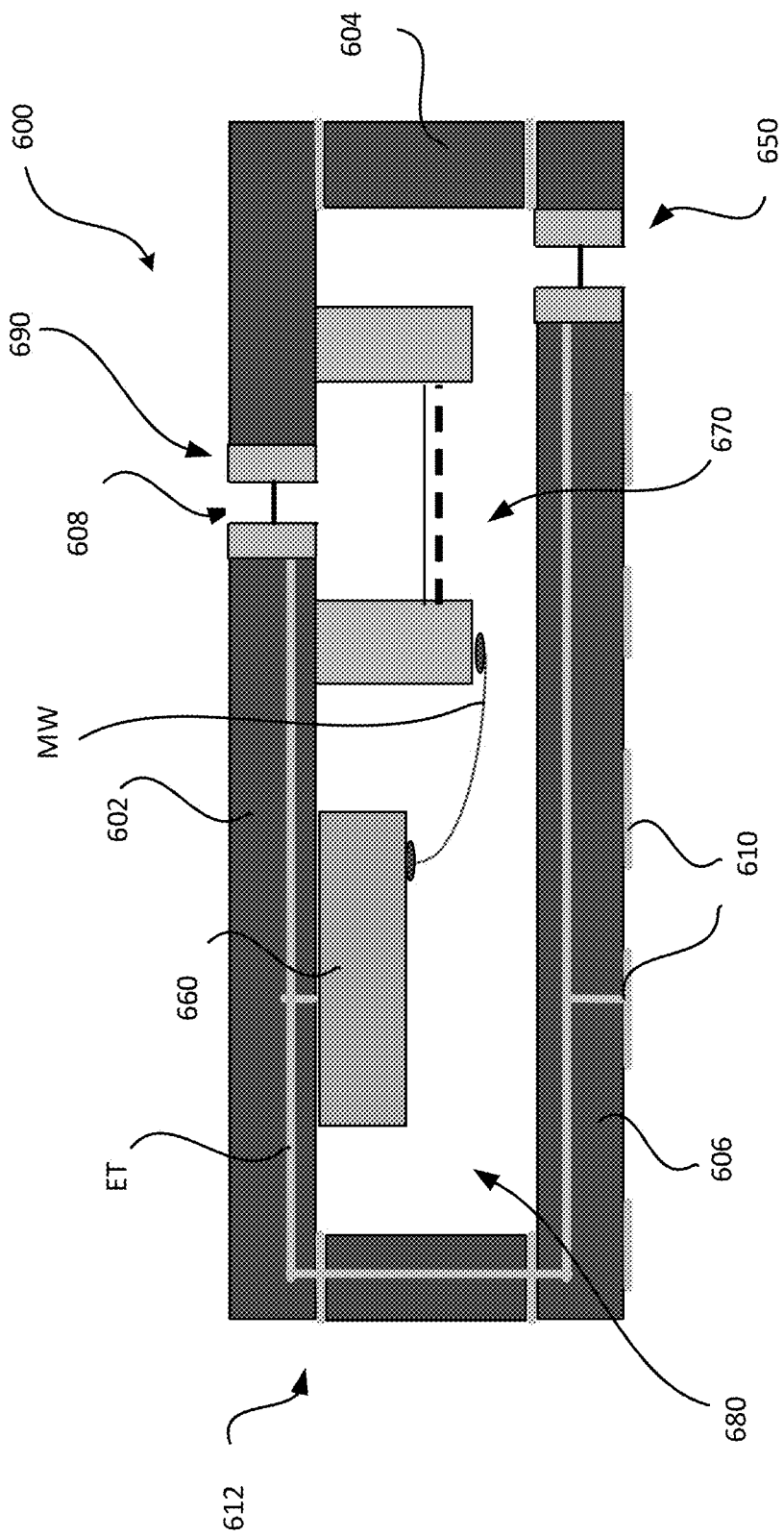
FIG. 6 is a cross-sectional view of an exemplary MEMS device package in accordance with another described embodiment of the disclosure.

FIG. 6 is a cross-sectional view of an exemplary MEMS device package 600 utilizing at least one sensor circuit 660 and a MEMS sensor 670 in accordance with another described embodiment of the disclosure. Unlike from the MEMS device package 500, the MEMS device package 600 includes first and second control devices 650, 690 embedded within the package housing 612. The first control device 650 is embedded within a bottom member 606 of the package housing 612 and the second control device 690 is embedded within an opening 608 formed on a top member 602 of the package housing 612. The control devices 650, 690 embedded within the package housing 612 may be formed from the same material as the package housing 612. The control devices 650, 690 and the package housing 612 are fabricated in a single or sample process. In some embodiments, the control devices 650, 690 and the package housing 612 may be fabricated in multiple process. As an example, the control devices 650, 690 are inserted and flushed within the port. A suitable attachment such as adhesive is applied to one of the control devices 650, 690 or the port to secure the control devices 650, 690 to inner wall of the port. In another example, the port includes a flange bent inwardly and the control devices 650, 690 is secured to the flange by any suitable method of attachments. In other example, the control devices, 650, 690 may be partially flushed within the port having a portion of the control devices 650, 690 either extended above the port or below the port. In one embodiment, the control devices 650, 690 is a rotating assembly having an inner member and an outer member rotatably coupled to the inner member. When the outer member turns in relation to the inner member, either clockwise or counterclockwise, the rotating assembly closes or open the port. In another embodiment, the control devices 650, 690 are flap to either close the port when the flap is fully extended or open the port when the flap is retracted. In some embodiments, the flaps 650, 690 may be moved in an upward motion or downward motion induced by stimuli, such as magnetic field, electric field, thermal, or the like. In yet another embodiment, the control devices 650, 690 are movable member such as a membrane, a diaphragm, or the like to either close the port when the moving member is fully extended or open the port when the moving member is retracted. In yet further embodiment, the control devices, 650, 690 are piezoelectric moving member that open and close the port to change the directivity functionality of the MEMS sensor 670. Otherwise suitable control device may be used to open and close the port to change the directivity functionality of the MEMS sensor 670. As depicted, the control device 690 embedded within the opening 608 serves to protect sensor circuit 660 and the MEMS sensor 670 from environmental debris and containment. The control device 650 also serves to change acoustic properties such as damping or resistance. The control devices 650, 690 may be controlled by the sensor circuit 660, a processor, a user input interface, or any suitable computer implemented device. As depicted, the control device 650 embedded within the bottom member 606 and is located behind the MEMS sensor 670 serves to change the directional properties of the MEMS sensor 670 mounted within a cavity 680 defined by the package housing 612. The control device 650 may be controlled by the sensor circuit 660, a processor, a user input interface, or any suitable computer implemented device to change the directivity of the MEMS sensor 670 from a directional mode when the control device 650 is open and to a non-directional mode such as omni-directional mode when the control device 650 is closed. The integration of the MEMS device 650 into the package housing 612 also changes the characteristics of the package 600. The processor or any suitable computer implemented device may be disposed in the package 600 or located outside the package 600. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (µP), a microcontroller (µC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. To interface with the control devices 650, 690, any suitable connections such as flip chip connection, bond wires, flex board, conductive layers, or the like may be used to connect the control devices 650, 690 to the sensor circuit 660, a processor, a user input interface, or any suitable computer implemented device which then are controlled to open and close the control devices 650, 690. The cavity 680 comprises a front volume 682 in fluidly coupled to the MEMS sensor device 670 via the opening 608 and a back volume 684 in fluidly coupled to the MEMS sensor 670 via the control device 650. The back volume 684 provides a pressure reference for the MEMS sensor 670. When the control device 650 is closed, the back volume is sealed, and the MEMS sensor 670 is tuned to omni-directional or non-directional MEMS sensor 670. When the control device 650 is open, the back volume is open, and the MEMS sensor 670 is tuned to directional MEMS sensor 670.

Figure 7:
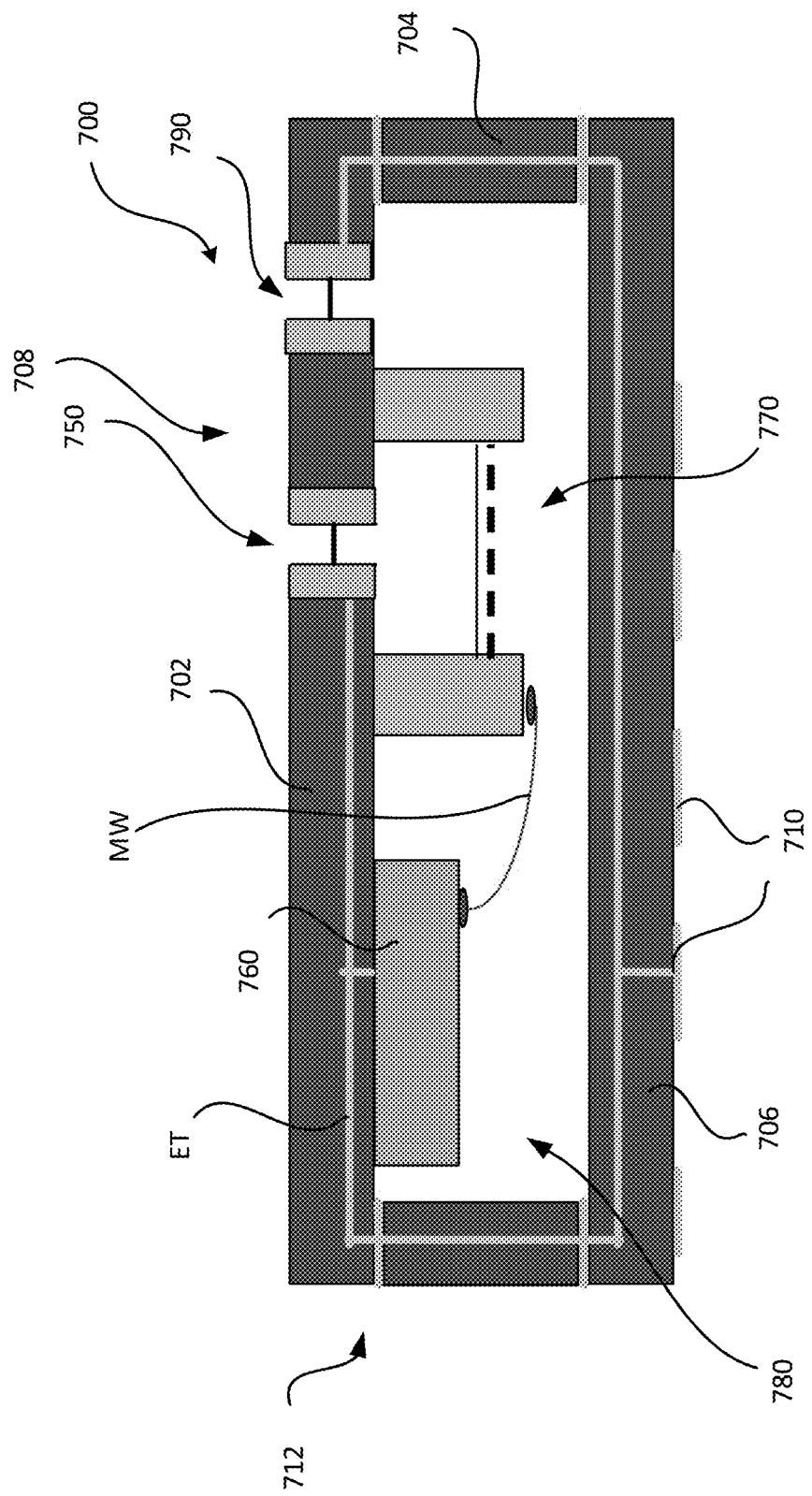
FIG. 7 is a cross-sectional view of an exemplary MEMS device package in accordance with another described embodiment of the disclosure.

FIG. 7 is a cross-sectional view of an exemplary MEMS device package 700 utilizing at least one sensor circuit 760 and a MEMS sensor 770 in accordance with another described embodiment of the disclosure. Unlike from the MEMS device package 600, the MEMS device package 700 includes first and second control devices 750, 790 adjacent to one another are embedded within the package housing 712. As illustrated, the first control device 750 is embedded within an opening 708 formed on a top member 702 of the package housing 712 and the second control device 790 is proximal to the first control device 750. In one example, formed with the opening 708 are first and second control devices 750, 750. In another example, a second opening may be formed to receive the second control device 790. The control devices 750, 790 embedded within the package housing 712 may be formed from the same material as the package housing 712. The control devices 750, 790 and the package housing 712 are fabricated in a single or sample process. In some embodiments, the control devices 750, 790 and the package housing 712 may be fabricated in multiple process. As an example, the control devices 750, 790 are inserted and flushed within the port. A suitable attachment such as adhesive is applied to one of the control devices 750, 790 or the port to secure the control devices 750, 790 to inner wall of the port. In another example, the port includes a flange bent inwardly and the control devices 750, 790 is secured to the flange by any suitable method of attachments. In other example, the control devices, 750, 790 may be partially flushed within the port having a portion of the control devices 750, 790 either extended above the port or below the port. In one embodiment, the control devices 750, 790 is a rotating assembly having an inner member and an outer member rotatably coupled to the inner member. When the outer member turns in relation to the inner member, either clockwise or counter-clockwise, the rotating assembly closes or open the port. In another embodiment, the control devices 750, 790 are flap to either close the port when the flap is fully extended or open the port when the flap is retracted. In some embodiments, the flaps 750,790 may be moved in an upward motion or downward motion induced by stimuli, such as magnetic field, electric field, thermal, or the like. In yet another embodiment, the control devices 750, 790 are movable member such as a membrane, a diaphragm, or the like to either close the port when the moving member is fully extended or open the port when the moving member is retracted. In yet further embodiment, the control devices, 750, 790 are piezoelectric moving member that open and close the port to change the directivity functionality of the MEMS sensor 770. Otherwise suitable control device may be used to open and close the port to change the directivity functionality of the MEMS sensor 670. As depicted, the control device 750 embedded within the opening 708 and directly below the MEMS sensor 770 serves to protect sensor circuit 760 and the MEMS sensor 770 from environmental debris and containment. The control device 790 also serves to change acoustic properties such as damping or resistance. The control devices 750, 790 may be controlled by the sensor circuit 760, a processor, a user input interface, or any suitable computer implemented device. As depicted, the control device 790 in proximal to the control device 750 is located outside and is not covered by the MEMS sensor 770 serves to change the directional properties of the MEMS sensor 770 mounted within a cavity 780 defined by the package housing 712. The control device 790 may be controlled by the sensor circuit 760, a processor, a user input interface, or any suitable computer implemented device to change the directivity of the MEMS sensor 770 from a directional mode when the control device 790 is open and to a non-directional mode such as omni-directional mode when the control device 790 is closed. The integration of the MEMS device 750 into the package housing 712 also changes the characteristics of the package 700. The processor or any suitable computer implemented device may be disposed in the package 700 or located outside the package 700. The processor may be of any type, including but not limited to a microprocessor, a microcontroller, a digital signal processor, an analog signal processor, or any combination thereof. The processor may include one or more levels of caching, such as a level cache memory, one or more processor cores, and registers. Depending on the desired configuration, the processor may be of any type, including but not limited to a microprocessor (µP), a microcontroller (µC), a digital signal processor (DSP), or any combination thereof. The processor may include one or more levels of caching, such as a level cache memory, one or more processor cores, and registers. The example processor cores may (each) include an arithmetic logic unit (ALU), a floating point unit (FPU), a digital signal processing core (DSP Core), or any combination thereof. An example memory controller may also be used with the processor, or in some implementations the memory controller may be an internal part of the processor. The user input interface may be a switch, a button, an interface, or any suitable interface. To interface with the control devices 750, 790, any suitable connections such as flip chip connection, bond wires, flex board, conductive layers, or the like may be used to connect the control devices 750, 790 to the sensor circuit 760, a processor, a user input interface, or any suitable computer implemented device which then are controlled to open and close the control devices 750, 790. The cavity 780 comprises a front volume 782 in fluidly coupled to the MEMS sensor device 670 via the opening 708 and a back volume 784 in fluidly coupled to the MEMS sensor 770 via the control device 790. The back volume 784 provides a pressure reference for the MEMS sensor 770. When the control device 790 is closed, the back volume is sealed, and the MEMS sensor 770 is tuned to omni-directional or non-directional MEMS sensor 770. When the control device 790 is open, the back volume is open, and the MEMS sensor 770 is tuned to directional MEMS sensor 770.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the sprit and scope of this disclosure.

While the patent has been described with reference to various embodiments, it will be understood that these embodiments are illustrative and that the scope of the disclosure is not limited to them. Many variations, modifications, additions, and improvements are possible. More generally, embodiments in accordance with the patent have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A microelectromechanical system (MEMS) sensor device comprising:
    a package housing having a top member, a bottom member, and a spacer coupled to the top member and to the bottom member, the package housing defining a cavity;
    at least one sensor circuit and a MEMS sensor disposed within the cavity of the package housing;
    a first opening formed on the package housing;
    a second opening formed on the package housing;
    a first control device embedded within the package housing; and
    a second control device disposed within the second opening for damping acoustic signals fluidly coupled to the MEMS sensor,
    wherein the first control device is configured to tune the MEMS sensor from a directional mode to an omni-directional mode.

2. The MEMS sensor device of claim 1 further comprising the first control device embedded within at least one of the top member, the bottom member, or the spacer.

3. The MEMS sensor device of claim 1 wherein the first and second control devices are electrically coupled to the sensor circuit.

4. The MEMS sensor device of claim 3 wherein the first and second control devices are selected from a group consisting of piezoelectric moving device, rotating device, a flap, and movable membrane.

5. The MEMS sensor device of claim 1 further comprising a processor, a user input interface, and a computer implemented device, wherein at least one of the processor, the user input interface, and the computer implemented device is electrically coupled to at least one of the first and second control devices.

6. A method of manufacturing a package housing for a MEMS sensor device comprising:
providing a top member, a bottom member, and a spacer;
providing a first opening within at least one of the top member, the bottom member, and the spacer;
providing a second opening within at least one of the top member, the bottom member, and the spacer;
mounting a sensor circuit and a MEMS sensor to at least one of the top member, the bottom member, and the spacer;
securing the spacer to the top and bottom members;
providing a first control device within at least one of the top member, the bottom member, or the spacer;
and providing a second control device within the second opening for damping acoustic signals fluidly coupled to the MEMS sensor.

7. The method of claim 6 wherein the first and second control devices are electrically coupled to the sensor circuit.

8. The method of claim 6 wherein:
the MEMS sensor device includes a processor, a user input interface, and a computer implemented device, and
at least one of the processor, the user input interface, and the computer implemented device is electrically coupled to at least one of the first and second control devices.

9. The method of claim 8 wherein the first and second control devices are selected from a group consisting of piezoelectric moving device, rotating device, a flap, and movable membrane.

10. A microelectromechanical system (MEMS) sensor device comprising:

a package housing having a top member, a bottom member, and a spacer coupled to the top member and to the bottom member, the package housing defining a cavity;
at least one MEMS sensor disposed within the cavity of the package housing;
a first opening formed on the package housing;
a second opening formed on the package housing; and
a first and a second control device embedded within the second opening,
wherein the second control device is configured for damping acoustic signals fluidly coupled to the MEMS sensor, and
wherein one of the first and second control devices is configured to tune the MEMS sensor from a directional mode to an omni-directional mode.

11. The MEMS sensor device of claim 10 wherein the first control device is located directly below the MEMS sensor and the second control device is proximal to the first control device, is located outside, and is not covered by the MEMS sensor.

12. The method of claim 11 wherein the first and second control devices are selected from a group consisting of piezoelectric moving device, rotating device, a flap, and movable membrane.

13. The MEMS sensor device of claim 12 further comprising a circuit communicatively coupled to the first and second control devices to tune the MEMS sensor from directional mode to omni-directional mode.

14. The MEMS sensor device of claim 13 wherein the circuit is selected from a group consisting of a processor, a user input interface, and a computer implemented device.

15. The MEMS sensor device of claim 14 wherein the circuit is disposed in the cavity of the package housing.

16. The MEMS sensor device of claim 14 wherein the circuit is located outside the package housing.

* * * * *